(12) United States Patent
Jiang

(10) Patent No.: US 11,101,453 B2
(45) Date of Patent: Aug. 24, 2021

(54) ORGANIC LIGHT EMITTING DIODE DISPLAY PANEL AND MANUFACTURING METHOD THEREOF

(71) Applicant: Wuhan China Star Optoelectronics Semiconductor Display Technology Co., Ltd., Hubei (CN)

(72) Inventor: Guoqiang Jiang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 501 days.

(21) Appl. No.: 16/077,401

(22) PCT Filed: Jun. 5, 2018

(86) PCT No.: PCT/CN2018/089934
§ 371 (c)(1),
(2) Date: Aug. 10, 2018

(87) PCT Pub. No.: WO2019/223024
PCT Pub. Date: Nov. 28, 2019

(65) Prior Publication Data
US 2021/0083231 A1    Mar. 18, 2021

(30) Foreign Application Priority Data

May 21, 2018   (CN) .......................... 201810491254.6

(51) Int. Cl.
*H01L 29/08* (2006.01)
*H01L 51/56* (2006.01)
(Continued)

(52) U.S. Cl.
CPC .......... *H01L 51/56* (2013.01); *H01L 51/0097* (2013.01); *H01L 51/5253* (2013.01); *H01L 2251/5338* (2013.01)

(58) Field of Classification Search
CPC ............. H01L 51/0097; H01L 51/5253; H01L 51/5246; H01L 51/56
See application file for complete search history.

(56) References Cited

U.S. PATENT DOCUMENTS

2004/0242115 A1* 12/2004 Yanagawa ......... H01L 29/78678
                                                      445/25
2015/0137098 A1   5/2015 Tanaka
(Continued)

FOREIGN PATENT DOCUMENTS

CN    104425550 A    3/2015
CN    105118389 A    12/2015
(Continued)

*Primary Examiner* — Phuc T Dang
(74) *Attorney, Agent, or Firm* — Leong C. Lei

(57) ABSTRACT

Disclosed are an organic light emitting diode display panel and a manufacturing method thereof. The method includes: providing a flexible substrate, comprising a display area, a bonding area, and a bending area disposed between the display area and the bonding area; fabricating an organic light emitting diode element in the display area on a first surface of the flexible substrate; fabricating a first back plate located in the display area on a second surface of the flexible substrate opposite to the first surface; coating curing adhesive on a portion of the second surface in the bonding area, and curing the curing adhesive to form a second back plate. In the manufacturing method of the organic light emitting diode display panel, by forming a supporting back plate, the generation of bubbles on the edges of the supporting back plate in the bonding area caused by the roller attachment can be avoided.

6 Claims, 3 Drawing Sheets

(51) Int. Cl.
*H01L 51/00* (2006.01)
*H01L 51/52* (2006.01)

(56) References Cited

U.S. PATENT DOCUMENTS

| | | | | |
|---|---|---|---|---|
| 2017/0294620 | A1* | 10/2017 | Park | H01L 51/5284 |
| 2018/0034002 | A1* | 2/2018 | Kim | H01L 51/0097 |
| 2018/0143499 | A1* | 5/2018 | Lim | G02F 1/136209 |
| 2018/0159087 | A1* | 6/2018 | Yug | H01L 27/323 |
| 2018/0226609 | A1* | 8/2018 | Li | H01L 51/0097 |

FOREIGN PATENT DOCUMENTS

| | | | |
|---|---|---|---|
| CN | 105989783 | A | 10/2016 |
| CN | 106449699 | A | 2/2017 |
| CN | 106887186 | A | 6/2017 |
| CN | 107564417 | A | 1/2018 |
| CN | 107565018 | A | 1/2018 |

* cited by examiner

ORGANIC LIGHT EMITTING DIODE DISPLAY PANEL AND MANUFACTURING METHOD THEREOF

RELATED APPLICATIONS

The present application is a National Phase of International Application Number PCT/CN2018/089934, filed Jun. 5, 2018, and claims the priority of China Application No. 201810491254.6, filed May 21, 2018.

FIELD OF THE INVENTION

The present invention relates to a display technology field, and more particularly to an organic light emitting diode display panel and a manufacturing method thereof.

BACKGROUND OF THE INVENTION

The Bezel Less (Organic Light-Emitting Diode) display panel gradually forms a popular design trend. The Bezel Less display refers to a display device with a very narrow screen frame, and uses a design in which the display screen and the frame are merged to create a visually invisible physical frame. Its great advantage is the outstanding appearance. Compared to displays with a thick frame in the prior art, "Bezel Less" can bring true horizontal screens, making the display more stylish in appearance. Another great advantage is that the display with Bezel Less technology can achieve good display splicing and achieve two-screen, triple-screen or even multi-screen, and the Bezel Less display can maximize the effect of the screen. In addition, the Bezel Less display can bring users a wider visual effect, eliminating the sense of restraint of the previous thick frame display.

At present, in order to realize the narrow frame structure of the organic light emitting diode display panel, one solution is to bend the edge of the organic light emitting diode display panel. In the bending process of the organic light emitting diode display panel, a supporting back plate needs to be provided on the back surface of the organic light emitting diode display panel to protect the organic light emitting diode display panel. The supporting back plate is a segmented back plate, so as to dodge the bending area. The supporting back plate is generally attached to the back surface of the organic light emitting diode display panel by means of a roller. Because the supporting back plate has a level difference in the bending area, the roller attachment is easy to generate bubbles at the edge to cause the weak adhesion of the supporting back plate on the bonding area.

SUMMARY OF THE INVENTION

In order to solve the deficiencies in the prior art, the present invention provides an organic light emitting diode display panel and a manufacturing method thereof, which can avoid generation of bubbles as attaching a back plate.

For realizing the aforesaid objective, the present invention provides the following technical solutions:

an organic light emitting diode display panel, comprising:
a flexible substrate, comprising a display area, a bonding area, and a bending area disposed between the display area and the bonding area;
an organic light emitting diode element, disposed on a first surface of the flexible substrate, wherein the organic light emitting diode element is located in the display area;
a first back plate, disposed on a second surface of the flexible substrate opposite to the first surface, wherein the first back plate is located in the display area;
a second back plate, disposed on the second surface and located in the bonding area, wherein the second back plate is formed of curing adhesive.

Optionally, the curing adhesive is ultraviolet curing adhesive.

Optionally, the first back plate is fabricated with polyethylene terephthalate.

The present invention further discloses a manufacturing method of an organic light emitting diode display panel, comprising:

S1, providing a flexible substrate, comprising a display area, a bonding area, and a bending area disposed between the display area and the bonding area;

S2, fabricating an organic light emitting diode element in the display area on a first surface of the flexible substrate;

S3, fabricating a first back plate located in the display area on a second surface of the flexible substrate opposite to the first surface;

S4, coating curing adhesive on a portion of the second surface in the bonding area, and curing the curing adhesive to form a second back plate.

Optionally, Step S4 specifically comprises:
coating ultraviolet curing adhesive on the portion of the second surface in the bonding area;
irradiating and curing the ultraviolet curing adhesive by ultraviolet light to form the second back plate.

Optionally, a duration of irradiating the ultraviolet curing adhesive by the ultraviolet light is 5 s to 10 s.

Optionally, a curing energy of the ultraviolet light is 1500 mj/cm$^2$.

Optionally, Step S3 comprises:
positioning the flexible substrate, where the organic light emitting diode element is fabricated, on a support table to position the organic light emitting diode element in a first indentation of the support table and to position a driving chip in the bonding area in a second indentation of the support table;
using a roller to attach the first back plate to the second surface.

Optionally, an attaching pressure of the roller is 0.2 MPa to 0.5 MPa.

Optionally, an attaching speed of the roller is 100 mm/s to 200 mm/s.

The benefits of the present invention are: in the organic light emitting diode display panel and the manufacturing method thereof disclosed by the present invention, by spraying the curing adhesive on the back surface of the bonding area of the flexible substrate and curing the curing adhesive to form a supporting back plate, the generation of bubbles on the edges of the supporting back plate in the bonding area caused by the roller attachment can be avoided to improve the adhesion of the supporting back plate. Meanwhile, it is also possible to avoid that the roller attachment causes the driver chip in the bonding area to break or fall off.

DETAILED DESCRIPTION OF PREFERRED EMBODIMENTS

For the purpose, technical solutions and advantages of the present invention will become clear and unambiguous, the embodiment of the present invention is described in further detail below with reference to the accompanying drawings, simultaneously. It should be noted that the specific embodiments described herein are merely for explaining the present invention and are not intended to limit the present invention.

Embodiment One

Figure 1:
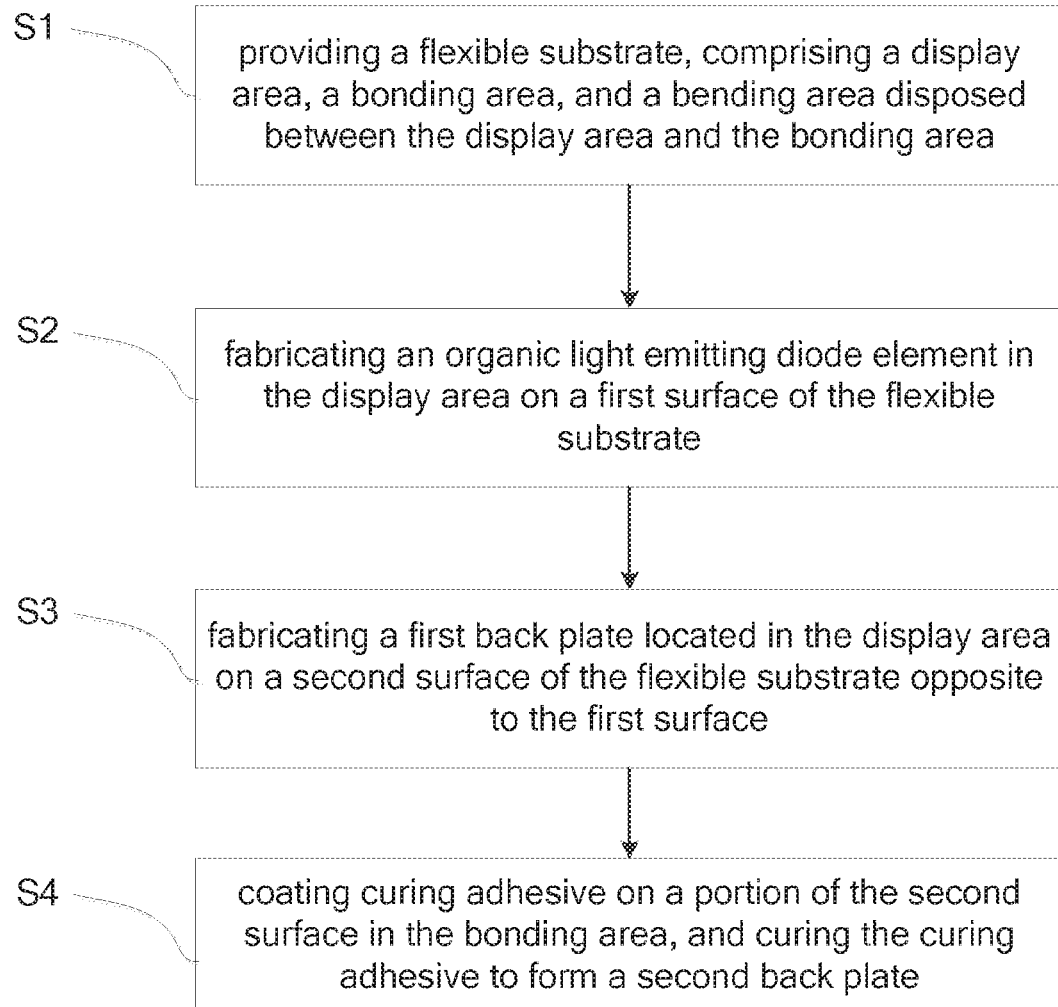
FIG. 1 is a flowchart of a manufacturing method of an organic light emitting diode display panel according to the first embodiment of the present invention.

FIG. 1 shows a flowchart of a manufacturing method of an organic light emitting diode display panel according to this embodiment. The manufacturing method comprises Step S1 to Step S4.

Figure 2A:
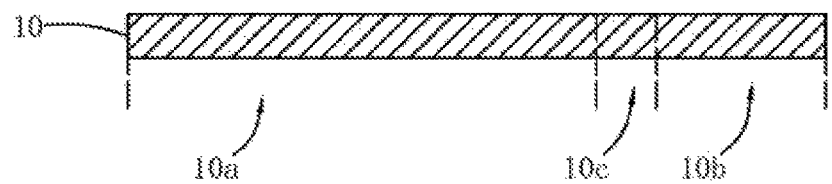
FIG. 2A to FIG. 2D are process diagrams of an organic light emitting diode display panel according to the first embodiment of the present invention.

Specifically, Step S1: referring to FIG. 2A, providing a flexible substrate 10, wherein the flexible substrate 10 comprises a display area 10a, a bonding area 101o, and a bending area 10c disposed between the display area 10a and the bonding area 10b, and the bending area 10c provides a bending area for the organic light emitting diode display panel, and no elements are disposed in this area.

Figure 2B:
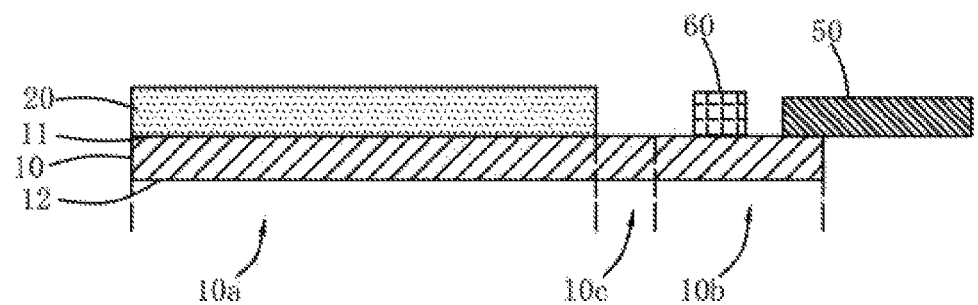

Step S2: referring to FIG. 2B, fabricating an organic light emitting diode element 20 on a first surface 11 of the flexible substrate 10, and the organic light emitting diode element 20 is in the display area 10a. Furthermore, elements such as a flexible circuit board 50 and a driver chip 60 are connected in the bonding area 10b.

Further, the organic light emitting diode element 20 can be formed on the flexible substrate 10 by processes such as evaporation, spin coating and inkjet printing. These processes are relatively mature and will not be described here.

Figure 2C:
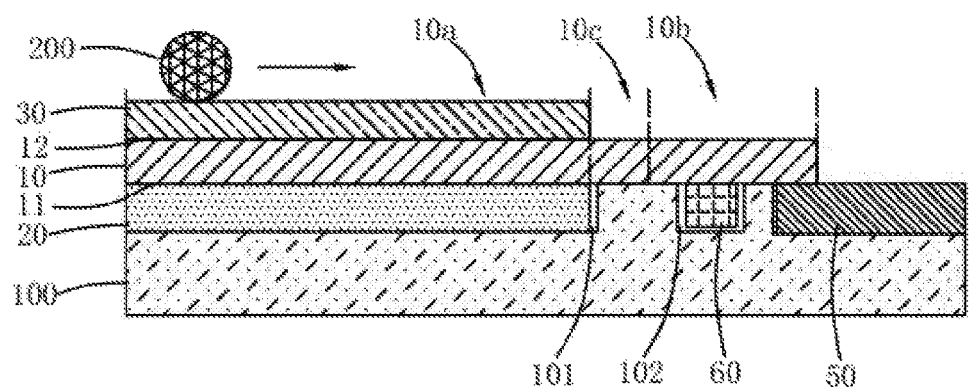

Step S3: referring to FIG. 2C, fabricating a first back plate 30 on a second surface 12 of the flexible substrate 10 opposite to the first surface 11, and the first back plate 30 is located in the display area 10a.

As a preferred embodiment, Step S3 specifically comprises Step S31 to Step S32.

Step S31: referring to FIG. 2C, positioning the flexible substrate 10, where the organic light emitting diode element 20 is fabricated, upside down on a support table 100, i.e. the first surface 11 of the flexible substrate 10 is positioned on the support table 100. The support table 100 has a first indentation 101 for dodging the organic light emitting diode element 20. Besides, since the flexible substrate 10 has been bound with the driver chip 60 or other elements, the support table 100 further has a second indentation 102 for dodging the driver chip 60.

Step S32: using a roller 200 to attach the first back plate 30 to the second surface 12. The rolling direction of the roller 200 is from the display area 10a toward the bending area 10c. An attaching speed of the roller 200 is 100 mm/s to 200 mm/s. Here; the attaching speed is the horizontal moving speed of the roller 200. An attaching pressure of the roller 200 is 0.2 MPa to 0.5 MPa. Here, the attaching pressure is the pressure applied by the roller 200 to the first back plate 30. Because the first back plate 30 in the display area 10a is a complete back plate, the bubbles do not easily generate when the rollers 200 performs attachment. A material of the first back plate 30 is preferably polyethylene terephthalate (PET).

Figure 2D:
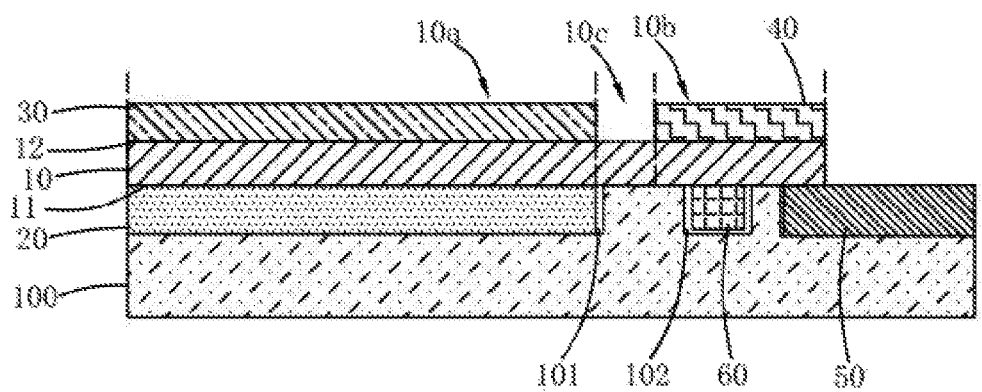

Step S4: referring to FIG. 2D, coating curing adhesive on a portion of the second surface 12 in the bonding area 10b, and curing the curing adhesive to form a second back plate 40.

As a preferred embodiment, Step S4 specifically comprises Step S41 to Step S42.

Figure 3A:
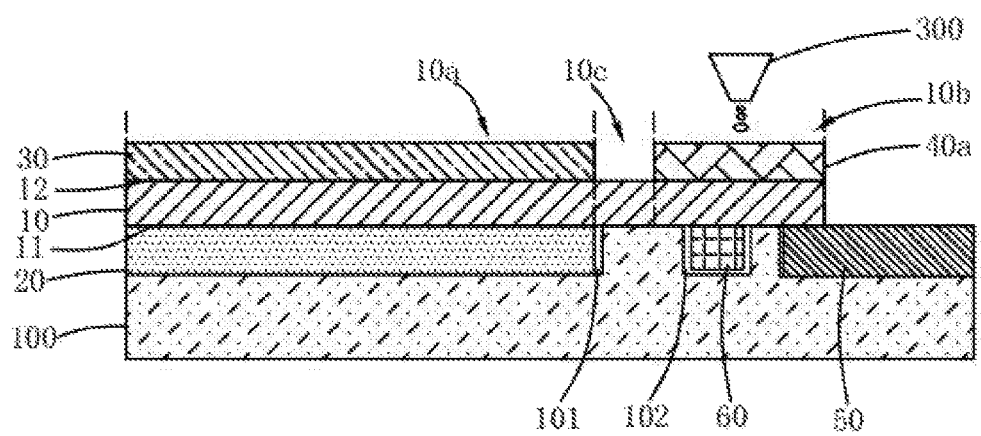
FIG. 3A to FIG. 3B are process diagrams of a second back plate according to the first embodiment of the present invention.

Step S41: referring to FIG. 3A, coating ultraviolet curing adhesive 40a on the portion of the second surface 12 in the bonding area 10b. As a preferred embodiment, a spraying device 300 is used to spray the ultraviolet curing adhesive in the bonding area 10b. Certainly, in other embodiments, the ultraviolet curing adhesive can also be coated in the bonding area 10b by a spin coating process. In addition, other types of curing adhesives, such as epoxy adhesive may be used, and the required curing adhesives are cured to form a back plate with a higher hardness.

Figure 3B:
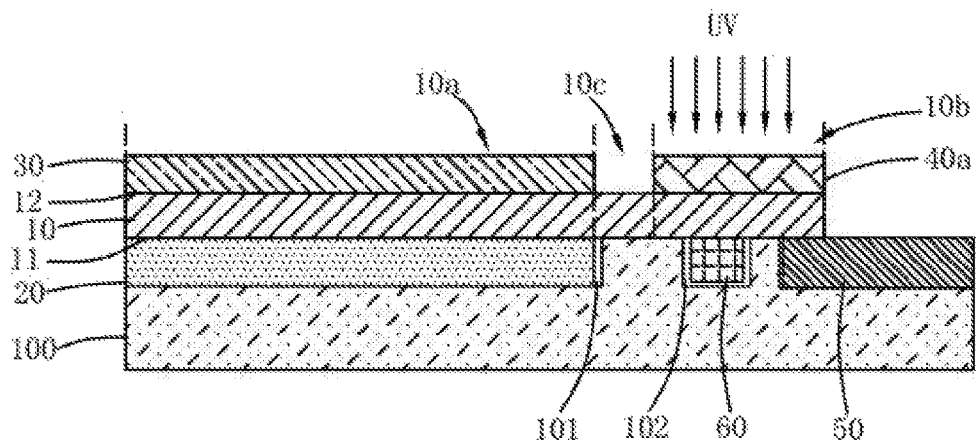

Step S42: referring to FIG. 3B, irradiating and curing the ultraviolet curing adhesive 40a by ultraviolet light to form the second back plate 40.

As a preferred embodiment, a curing energy of the ultraviolet light is 1500 mj/cm$^2$. The definition of mj/cm$^2$ is that the received energy per square centimeter is 1 millijoule. A curing duration of the ultraviolet light is 5 s to 10 s. In the curing process, the ultraviolet light is only irradiated on the bonding area 10b to prevent the ultraviolet light from damaging other elements of the organic light emitting diode display panel.

In the manufacturing method of the organic light emitting diode display panel, by spraying the curing adhesive on the back surface of the bonding area of the flexible substrate and curing the curing adhesive to form a supporting back plate, the generation of bubbles on the edges of the supporting back plate in the bonding area caused by the roller attachment can be avoided to improve the adhesion of the supporting back plate. Meanwhile, it is also possible to avoid that the roller attachment causes the driver chip in the bonding area to break or fall off.

Embodiment Two

As shown in FIG. 2C, the organic light emitting diode display panel according to the embodiment of the present invention comprises a flexible substrate 10, an organic light emitting diode element 20, a first back plate 30 and a second back plate 40, wherein the flexible substrate 10 comprises a display area 10a, a bonding area 10b and a bending area 10c between the display area 10a and the bonding area 10b. The organic light emitting diode element 20 is disposed on a first surface 11 of the flexible substrate 10, and the organic light emitting diode element 20 is located in the display area 10a. The first back plate 30 is attached on a second surface 12 of the flexible substrate 10 opposite to the first surface 11, and the first back plate 30 is located in the display area 10a. The second back plate 40 is disposed on a second surface 12, and the second back plate 40 is located in the bonding area 10b, wherein the second back plate 40 is formed by curing the curing adhesive. The first back plate 30 and the second back plate 40 are spaced to dodge the bending area 10c.

As a preferred embodiment, a material of the first back plate 30 is preferably polyethylene terephthalate (PET), and a material of the curing adhesive is preferably ultraviolet curing adhesive.

In the organic light emitting diode display panel, by curing the curing adhesive on the back surface of the bonding area of the flexible substrate to form a supporting back plate, the generation of bubbles between the supporting back plate and the flexible substrate can be avoided. Meanwhile, it is also possible to avoid that the roller attachment causes the driver chip in the bonding area to break or fall off.

The detailed description of the specific embodiments of the present invention has been described as aforementioned. Although some embodiments have been shown and described, it will be understood by those skilled in the art that the principle and spirit of the present invention can be understood without departing from the scope defined by the claims and their equivalents. Under the circumstances, these embodiments can be modified and improved, and these modifications and improvements should also fall within the protection scope of the present invention.

What is claimed is:

1. A manufacturing method of an organic light emitting diode display panel, comprising:
    S1, providing a flexible substrate, comprising a display area, a bonding area, and a bending area disposed between the display area and the bonding area;
    S2, fabricating an organic light emitting diode element in the display area on a first surface of the flexible substrate;
    S3, fabricating a first back plate located in the display area on a second surface of the flexible substrate opposite to the first surface;
    S4, coating curing adhesive on a portion of the second surface in the bonding area, and curing the curing adhesive to form a second back plate;
    wherein Step S3 comprises:
    positioning the flexible substrate, where the organic light emitting diode element is fabricated, on a support table to position the organic light emitting diode element in a first indentation of the support table and to position a driving chip in the bonding area in a second indentation of the support table;
    using a roller to attach the first back plate to the second surface.

2. The manufacturing method of the organic light emitting diode display panel according to claim 1, wherein Step S4 specifically comprises:
    coating ultraviolet curing adhesive on the portion of the second surface in the bonding area;
    irradiating and curing the ultraviolet curing adhesive by ultraviolet light to form the second back plate.

3. The manufacturing method of the organic light emitting diode display panel according to claim 2, wherein a duration of irradiating the ultraviolet curing adhesive by the ultraviolet light is 5 s to 10 s.

4. The manufacturing method of the organic light emitting diode display panel according to claim 2, wherein a curing energy of the ultraviolet light is 1500 mj/cm$^2$.

5. The manufacturing method of the organic light emitting diode display panel according to claim 1, wherein an attaching pressure of the roller is 0.2 MPa to 0.5 MPa.

6. The manufacturing method of the organic light emitting diode display panel according to claim 1, wherein an attaching speed of the roller is 100 mm/s to 200 mm/s.

* * * * *